United States Patent [19]

Watanabe

[11] 4,130,900
[45] Dec. 19, 1978

[54] MEMORY WITH COMMON READ/WRITE DATA LINE AND WRITE-IN LATCH CIRCUIT

[75] Inventor: Masafumi Watanabe, Kawasaki, Japan

[73] Assignee: Tokyo Shibaura Electric Co., Ltd., Kanagawa, Japan

[21] Appl. No.: 790,815

[22] Filed: Apr. 25, 1977

[30] Foreign Application Priority Data

Apr. 26, 1976 [JP] Japan ................................. 51-47379

[51] Int. Cl.[2] ........................... G11C 8/00; G11C 7/06
[52] U.S. Cl. ..................................... 365/230; 365/189
[58] Field of Search ..................... 340/173 R; 365/189, 365/230, 184, 185

[56] References Cited

U.S. PATENT DOCUMENTS 3,906,461  9/1975  Cappon ........................... 340/173 R

OTHER PUBLICATIONS

Geilhufe, More Bits/Chip Leads to Economical Semiconductor Memory Systems, EDN, 02201973, pp. 76-81.

Schlageter et al., Two 4k Static 5-v RAM's, IEEE Journal of Solid-State circuits, vol. SC-11, No. 5, 101976, pp. 602-609.

Primary Examiner—Stuart N. Hecker
Attorney, Agent, or Firm—Oblon, Fisher, Spivak, McClelland & Maier

[57] ABSTRACT

A latch circuit is provided on the input side of write-in circuit of a semiconductor memory device which is so formed that a common data line is used for data writing-in and data reading-out. Write-in data read serially into the latch circuit in a word unit is temporarily stored and held, so that the data is written simultaneously into various memory cells for in column units of the memory array.

6 Claims, 3 Drawing Figures

MEMORY WITH COMMON READ/WRITE DATA LINE AND WRITE-IN LATCH CIRCUIT

BACKGROUND OF THE INVENTION

1. Field of the Invention

The present invention relates to a semiconductor memory device, and more particularly to a PROM (Programmable Read Only Memory) with a short data write-in time.

2. Description of the Prior Art

Recently, the PROM, which is one kind of a read-only memory has been widely used in computers and other data processors. Sub-routines and the like used in the data processor are written in the PROM in advance for use as a memory. Now, if the individual memory cells consist of floating gate type MOS transistors or the like, the memory contents can be erased, for instance by irradiation with ultra-violet rays from outside, and the data can again be written therein. Therefore, this is an extremely useful memory device in the development of new data processing techniques and the like.

In conventional write-in control of the PROM, the data in each word unit is written into a memory array and the program operation is repeated serially on each word. Therefore, as the memory capacity for one chip becomes greater the time required for writing in becomes longer to the same extent, since data can be written in only one word unit. For instance in the case of N channel type MOS of the floating gate type the data write-in time in a unit memory cell is no more than 100 msec, but the program time required for the whole of a memory array with for instance a 1K word is 100 sec. As a method of making the program time shorter, an easy way is the procedure of making the number of bits for one word (ordinarily about 8 bits) extremely large, whereby the number of words is made smaller while the memory capacity remains the same. But if the number of bits for a unit word in the memory array is increased, the data lines become more numerous and therefore the number of external terminals for input and output increases, the merit of LSI (large scale integrated circuits) is impaired, and also trouble occurs at the interfaces with CPU and other external equipment.

Accordingly, with the known PROM the read-out time is short (400 to 500 nsec) and it has satisfactory characteristics as regards use. But on the other hand the time for writing in specific data, programs and the like is very long, and this fact has become a source of difficulty more particularly in checking the characteristics of mass-produced PROM, and in cases in which data needs to be written into a large number of PROMs in a short time, and the like.

BRIEF SUMMARY OF THE INVENTION

It is therefore an object of the present invention to provide a semiconductor memory device in which the data write-in time is short.

It is a further object of the present invention to provide a PROM in which it is possible to write data simultaneously into memory cells corresponding to a plurality of word addresses.

According to this invention, a semiconductor memory device comprises: (a) a memory array consisting of a plurality of memory cells arranged in XY matrix form, (b) an X decoder for designating the X direction address of the memory cells, (c) a Y decoder for designating the Y direction address of the memory cells, (d) a first Y direction gate circuit connected to the Y decoder and the memory array for reading out the data addressed by the X and Y decoders, (e) a read-out control circuit connected to the first Y direction gate circuit, (f) a plurality of data lines connected to the read-out control circuit for common data writing-in and data reading out, (g) a write-in circuit having a second Y direction gate circuit connected to the data lines for reading data therein in a word unit in sequence and for selecting a plurality of memory cells in sequence in accordance with Y address signals designating the memory cells, (h) a latch circuit connected to the second Y direction gate circuit for temporarily storing data read in the gate circuit, and (i) a write-in control circuit connected to the latch circuit and the memory array for writing data held in the latch circuit into the respective memory cells selected by the second Y direction gate circuit.

BRIEF DESCRIPTION OF THE DRAWINGS

The invention is illustrated by way of example in the accompanying drawings which form part of this application and in which.

DETAILED DESCRIPTION OF THE PREFERRED EMBODIMENT

Figure 1:
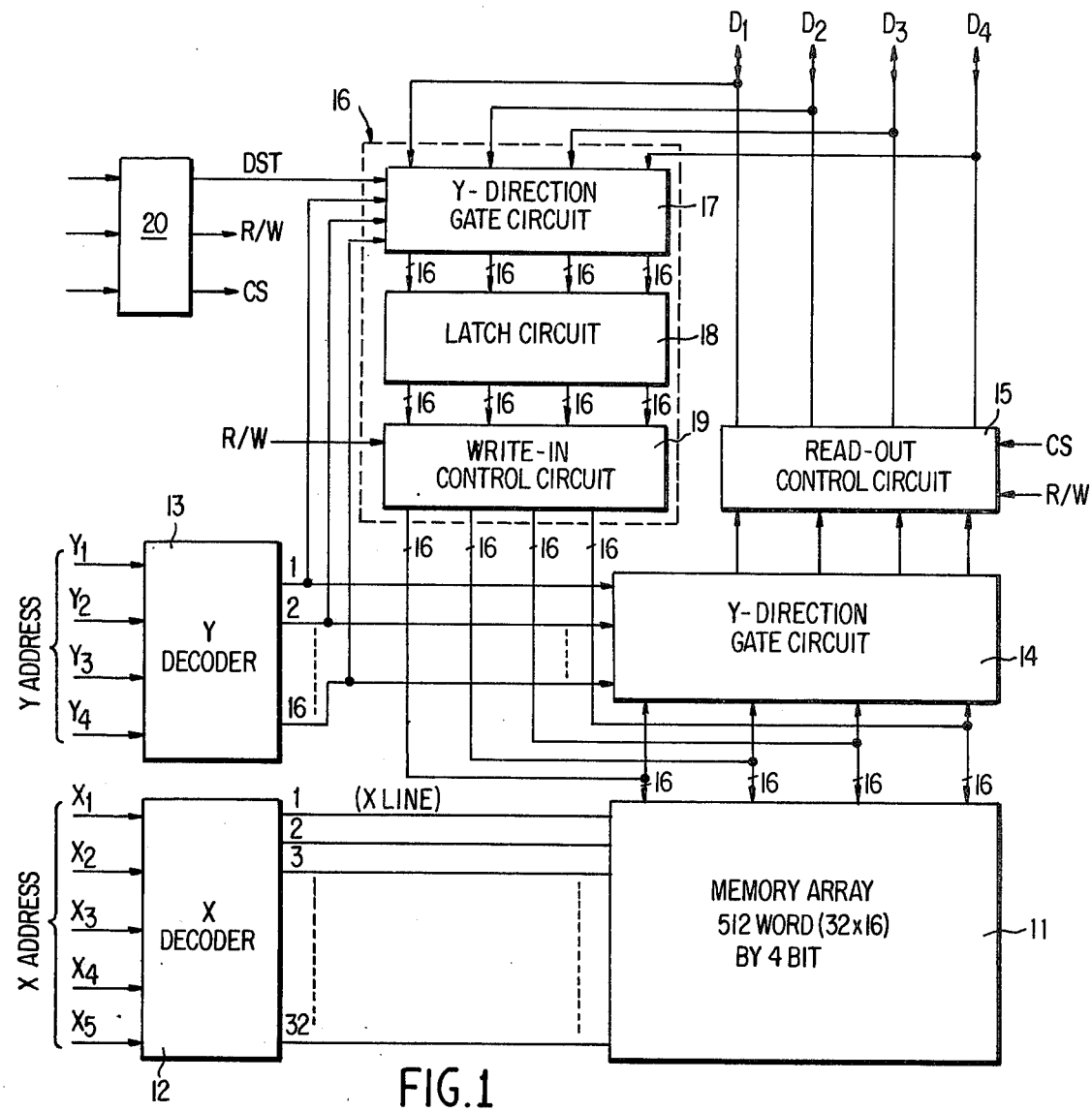
FIG. 1 shows a block diagram of a preferred embodiment of the present invention.

Referring now to the drawings wherein like reference numerals refer to identical or corresponding parts throughout the specification and more particularly to FIG. 1 thereof, one embodiment according to the present invention is illustrated.

In FIG. 1, a PROM device having a 512 word (32 × 16) by 4 bit capacity is shown as an example. All Y (column) address memory cells (16 × 4) are treated as a unit so that programming of the write-in data is carried out simultaneously, and the write-in time for each chip of the PROM can thus be shortened.

Memory array 11 consists of 512 words (512 × 4 memory cells) in a matrix form. An X decoder 12 designates addresses in the X (row) direction of this memory array 11, and a Y decoder 13 designates addresses in the Y (column) direction, whereby in a read-out mode a word address in the memory array 11 is designated. That is to say the data from the designated address is read out by way of a Y direction gate circuit 14 to a read-out control circuit 15. The read-out control circuit 15 is connected to the external terminals of this PROM chip by way of data lines $D_1$ to $D_4$, whereby 4 bit data forming a unit word is read out to the outside.

These external terminals are also used as input terminals for writing in data when data is being written in. In the write-in mode, input data on lines $D_1$ to $D_4$ is fed to a write in circuit 16 which constitutes the essence of this invention. This write in circuit 16 consists of a Y direction gate circuit 17 for reading 4 bit data constituting a unit word from the lines $D_1$ to $D_4$ in succession, a latch circuit 18 for temporarily storing data read in by the gate circuit 17, and a write-in control circuit 19. In other words, separate from the above-mentioned Y direction gate circuit 14 for reading out, the gate circuit 17 is provided in a stage before the write-in control circuit 19 and is controlled by the outputs of the above-mentioned Y (column) decoder 13, that is to say by the Y direction address signals. Also a data strobe signal DST is supplied to the gate circuit 17 so that the latch circuit 18 is made to store temporarily the write-in data going to the Y (column) direction memory cells. The number of bits in the latch circuit 18 is the same as that of the memory cells (16 × 4) arranged in an X line. Also, a control signal generating circuit 20 is provided for generating the above-mentioned control signals of various kinds.

Figure 2:
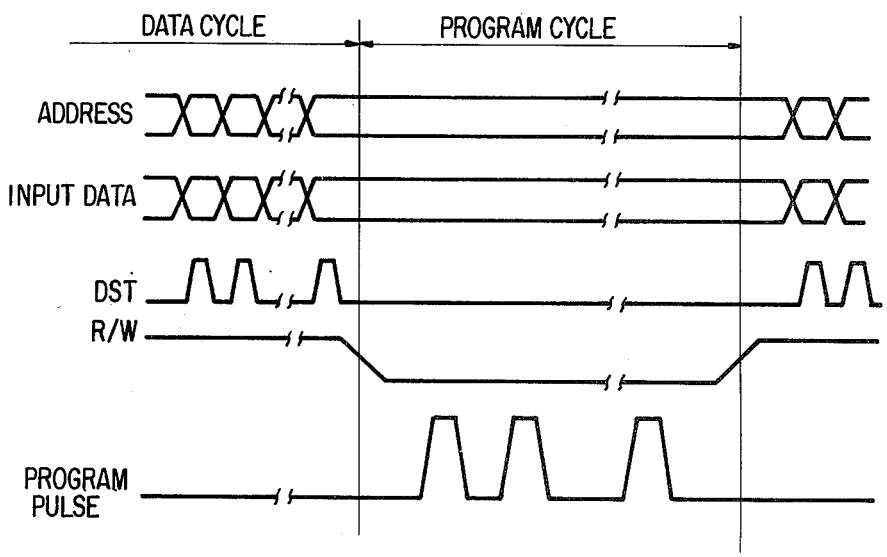
FIG. 2 shows a timing diagram of the programming operation of the memory device shown in FIG. 1.

FIG. 2 shows a timing diagram which illustrates the operational timing for the PROM of the above embodiment during the writing in of data, according to positive logic; this program mode is divided into a period (data cycle) in which the read out and write in signal R/W is at the "1" (high) level and a period (program cycle) in which R/W is at the 37 0" (low) level, and these are repeated alternately. Also, the arrangement is such that the signal R/W is supplied to the read-out control circuit 15 and the write-in circuitry 16, and the chip select signal is supplied to the read-out control circuit 15. Now, the data strobe signal DST is supplied to the gate circuit 17, whereby the timing of the data latches is controlled.

First, in the data cycle R/W="1" and CS="0", so that the operation of the write-in control circuits 19 and that of the read-out control circuits 15 is pevented, and the state is such that only data input from the data lines $D_1$ to $D_4$ to latch circuit 18 is possible. At this time, Y address signals are also supplied to the gate circuit 17 from the Y decoder 13, and the data coming in as input is gated in accordance with the address sequence at this time and is read into the latch circuit 18. This read-in timing is determined by the data strobe signals DST synchronized with the data sequence, and the lower order bits of the address signals are first made to correspond to the column direction of the memory array 11, and the higher order bits are made to correspond to the inputs of X decoder 12, whereby the data supplied serially is latched with full bits (16 × 4 bits) in the latch circuit 18 within a short time.

Next, one makes R/W = "0" and CS = "0" and changes to the program cycle, whereupon the write-in control circuits 19 go into the state in which they can operate, and the program pulses are supplied simultaneously to a specified 16 × 4 memory cells in accordance with the write-in data which had been temporarily held in the latch circuit 18 in the above-mentioned data cycle. During one program cycle the outputs of the X decoder 12 are fixed, for instance designating X line (1), and all of the data which is selected by the Y decoder 13 and read into the latch circuits 18 simultaneously written into the memory array 11. Thus, data is programmed simultaneously for a group of memory cells, within the memory array 11, which have received address signals from decoder 12 and have been designated by the gate circuit 17, and after that the data cycle and the program cycle are carried out again for a memory cell group corresponding to the next addresses from the X decoder 12 and Y decoder 13.

In this way, by the provision of a latch circuit 18 and a writing-in control circuit 19 each associated with a plurality of memory cells, for instance all the memory cells in one row, the data writing-in time is made very much shorter than in the case of the known arrangement in which the writing in of the data was carried out in word units. That is to say, as described above, the arrangement is such that the lower order address bits are assigned to the memory cells in the column direction of the memory array 11 and the higher order bit address signals are supplied to the X decoder 12. Therefore in the programming operation when data is being written in, no restriction at all is applied to sequential data supply as in the known PROM, and in the read mode during reading out, when the device is set so that R/W = "0" and DST = "1" the operation of the latch circuit 18 and that of the read-in control circuit 19 are prevented. Accordingly all ordinary control methods can be introduced as in the known PROM.

Also, as regards the essence of this invention it does not matter whether it operates with positive or with negative logic. The design will, of course, be modified in accordance with the characteristics of signals supplied from outside. Furthermore, the simultaneous data programming of the memory cells may be carried out either with row units or with column units. In each of these cases the memory cells making up a row (column) may be divided into a plurality of blocks each having some unit words, and sequential programming may be carried out for each block.

Figure 3:
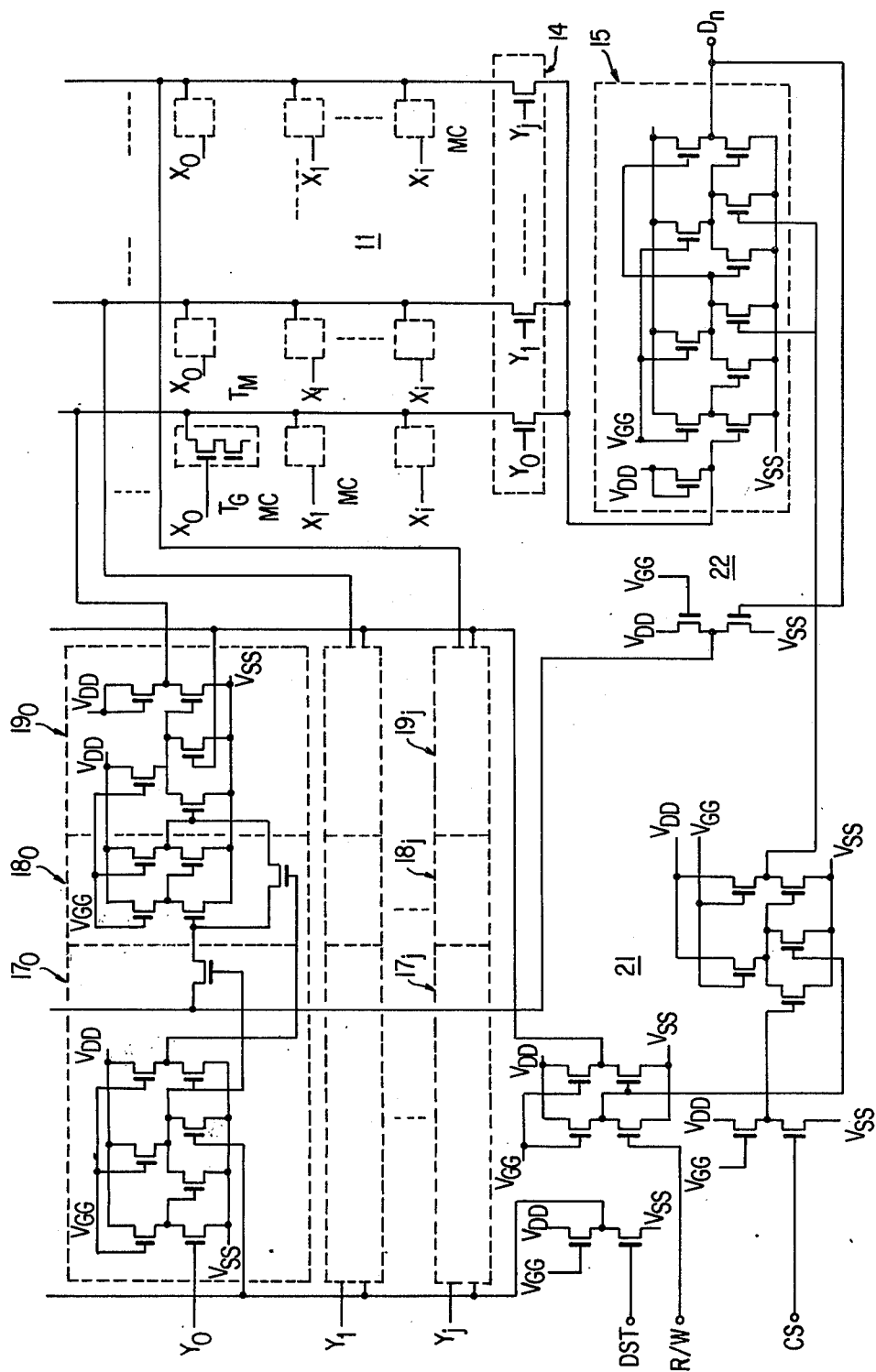
FIG. 3 shows a detailed circuit diagram of the memory device shown in FIG. 1.

FIG. 3 is a drawing showing the detailed circuit diagram shown in FIG. 1. The memory array 11 is made up of memory cells MC forming a (i + 1) × (j + 1) matrix (1 bit 1 word), and a respective floating gate type MOS transistor $T_M$ is used in each memory cell MC. $T_G$ denotes switching transistors which are subjected to switching control by X (row) direction address signals $X_O$ to $X_i$ applied to their gates. Here, the address decoders, that is to say the X decoder 12 and the Y decoder 13 of FIG. 1, are not shown. The gate circuit 14 consists of (j + 1) FETs, and a respective one of the address signals $Y_O$ to $Y_j$ for column selection is applied to each of these, and they are connected to a single data line $D_n$ by way of the read-out control circuit 15 controlled by the control circuit 21. Also, the above-mentioned data line $D_n$ is connected to the gate circuits $17_O$ to $17_j$ by way of a bias setting circuit 22. The arrangement is such that when data is being written in, this line receives input data supplied sequentially from input terminals, and by means of this bias circuit 22 the data is read into the latch circuits $18_O$ to $18_j$ in order.

For this purpose, both address signals $Y_O$ to $Y_j$ for column selection and also data strobe signals DST from the control signal generating circuit 20 are supplied to the above-mentioned gate circuit 17. The latch circuits $18_O$ to $18_j$ each comprise for instance 5 FETs, so that they temporarily store the respective output signals of the gate circuits $17_O$ to $17_j$. R/W signals are supplied from the control circuit 21 to the write-in control circuits $19_O$ to $19_j$, each formed in correspondence with a respective one of these latch circuits $18_O$ to $18_j$. The arrangement is such that when this R/W signal is "0", a program pulse is applied selectively to the memory cell with the same address $(X_O)$ in each column, whereby the operation of writing the data in can be carried out.

With a PROM constructed in this way, memory cells corresponding to (j + 1) addresses are programmed simultaneously. Therefore if the time required for programming a known, one chip, PROM is Tp (=N × $t_p$: N is the number of words for one chip, and $t_p$ is the necessary programming time for one memory cell), then a PROM having the same memory capacity can now be programmed in the time $(T_p/j+1) +a)$. Here, $a$ designates the total of the data cycles, that is to say, the data write-in time for latch circuit 18. A data cycle is about 100 ns to 1 μs, so that this is only a practically negligible time as compared with a programming time of 100 milliseconds for one address. Accordingly, the PROM of FIG. 3 reduces the write-in time almost to (1/j + 1) of that of the known PROM.

In the above embodiment the matrix of the memory array 11 is an (i + 1) × (j + 1) matrix, and if the number of columns (j+1) of the matrix is increased, the write-in time shortening effect becomes still more marked although the memory capacity remains the same. In this case, however, the area occupied by the latch circuits and write-in circuitry and other control circuits around the memory array becomes greater. Also, in the above embodiment only one data line is shown, but if there are a number of data lines $D_1$ to $D_n$ as in FIG. 1, the word structure need not be one bit to one word but may be for instance 4 bits to 1 word or 8 bits to 1 word. These structures of the memory array and numbers of data lines are largely restricted by the balance between chip area and number of external terminals, and it is desirable to take these points into consideration in determining the relationship between the write-in time shortening effect and the quantity of data that can be stored, that is to say the memory capacity. Now, if the above embodiment is a semiconductor memory device for read-out only, in which writing in is possible electrically (PROM), the individual memory cells are not restricted to the floating gate type MOS structure, and accordingly the structure of the write-in control circuit 19, the gate circuit 17 and the latch circuit 18 can also be modified in various ways in carrying the invention into effect. In particular, as regards the write-in control circuit 19, for instance in the case of change in word structure and also of construction of multi-chip memory device, various different structures and connection relationships will very naturally become necessary. For example, in the above embodiment, column address signals $Y_O$ to $Y_j$ are adopted so that in row units (j+1) memory cells are selected in succession by the gate circuits $17_O$ to $17_j$, but it is also possible to carry out programming simultaneously to a plurality of memory cells designated by row address signals $X_O$ to $X_j$.

As described above, when this invention is used the data write-in time of a semiconductor memory device employed as a PROM in data processing can be very greatly shortened and the checking of its characteristics, and programming by the user, can be carried out rapidly, and also this can be applied to memory device with any write-in system, without substantial modification of the program mode and read mode of the known PROM.

Obviously, numerous modifications and variations of the present invention are possible in light of the above teachings. It is therefore to be understood that within the scope of the appended claims the invention may be practiced otherwise than as specifically described herein.

What is claimed as new and desired to be secured by letters patent of the United States is:

1. A semiconductor memory device comprising:
   (a) a memory array consisting of a plurality of memory cells arranged in XY matrix form,
   (b) an X decoder for designating the X direction address of the memory cells,
   (c) a Y decoder for designating the Y direction address of the memory cells,
   (d) a first Y direction gate circuit connected to the Y decoder and the memory array for reading out the data addressed by the X and Y decoders,
   (e) a read-out control circuit connected to the first Y direction gate circuit,
   (f) a plurality of data lines connected to the read-out control circuit for common data writing-in and data reading out,
   (g) a write-in circuit having a second Y direction gate circuit connected to the data lines for reading data therein in a word unit in sequence and for selecting a plurality of memory cells in sequence in accordance with Y address signals designating the memory cells, a latch circuit connected to the second Y direction gate circuit for temporarily holding data read in the gate circuit and a write-in control circuit connected to the latch circuit and the memory array for writing data held in the latch circuit into the respective memory cells selected by the second Y direction gate circuit.

2. The semiconductor memory device according to claim 1 wherein the memory cell comprises a floating gate type MOS transistor.

3. The semiconductor memory device according to claim 2 including means for applying a control signal to the second Y direction gate circuit and a read-write signal to both the write-in control circuit and the read-out control circuit, whereby the read-write signal defines a data cycle and a program cycle of the write-in mode, in the data cycle the data in the Y direction gate circuit is written into the latch circuit in synchronization with the control signal and in the program cycle the data in the latch circuit is written into the addressed memory cells by applying a program pulse thereto.

4. The semiconductor memory device according to claim 1 wherein the memory array consists of a plurality of unit words, the data being simultaneously written into all of the memory cells arranged on an X line.

5. The semiconductor memory device according to claim 1 wherein a plurality of unit words are arranged on an X line and which is divided into a plurality of blocks, each consisting of some unit words, whereby the data is simultaneously written for each block.

6. The semiconductor memory device according to claim 4, the lower order address bits being assigned to the memory cells in the Y direction of the memory array and the higher order address bits being assigned to the X direction thereof.

* * * * *